United States Patent [19]

Hellstern

[11] Patent Number: 4,843,712
[45] Date of Patent: Jul. 4, 1989

[54] METHOD AND APPARATUS FOR HANDLING PARTS

[75] Inventor: Richard Hellstern, Cranbury, N.J.

[73] Assignee: American Telephone and Telegraph Company, AT&T Technologies, Inc., Berkeley Heights, N.J.

[21] Appl. No.: 240,022

[22] Filed: Sep. 2, 1988

[51] Int. Cl.$^4$ .................... H05K 3/30; B23P 19/00
[52] U.S. Cl. ........................... 29/834; 29/741; 414/224; 414/783; 414/786; 901/8
[58] Field of Search ............. 29/842, 845, 741, 834; 414/224, 225, 783, 758, 786; 901/8

[56] References Cited

U.S. PATENT DOCUMENTS

| | | | |
|---|---|---|---|
| 2,881,899 | 4/1959 | Rasmussen | 198/33 |
| 3,611,562 | 10/1971 | Herb | |
| 4,304,514 | 12/1981 | Pfaff | 414/224 |
| 4,457,662 | 7/1984 | Ireland et al. | 414/783 X |
| 4,551,913 | 11/1985 | Campisi | 414/224 X |
| 4,636,126 | 1/1987 | Spotts | 414/224 X |
| 4,731,924 | 3/1988 | Rapp | 29/741 X |

*Primary Examiner*—Timothy V. Eley
*Assistant Examiner*—Carl J. Arbes
*Attorney, Agent, or Firm*—Robert B. Levy

[57] ABSTRACT

Individual components (12) in a tube (14) are successively removed and then oriented for pickup by first positioning the tube, whose ends are opened, in a horizontal orientation such that the components in the tube are upside down. Thereafter, a component is at least partially expelled from one end of the tube by directing a stream of gas (e.g., air) into the other end of the tube. The component partially expelled from the tube is then withdrawn from the tube to locate the component between a pair of jaws (124) capable of rotation about an arc of 180°. The jaws then engage the component and thereafter rotate it 180° before positioning the component right side up.

16 Claims, 8 Drawing Sheets

METHOD AND APPARATUS FOR HANDLING PARTS

TECHNICAL FIELD

This invention relates to a method and apparatus for handling parts, and more particularly, to a method and apparatus for unloading electronic components stored in a shipping tube.

BACKGROUND ART

Many types of electronic components, such as mercury relay packages and transformers, for example, are comprised of a prismatic body which has a set of leads extending either from its bottomor from one or both of its sides or ends. Such components, referred to as "prismatic components" because of their shape, are often fabricated in a first factory and then shipped to a second factory for mounting on a substrate such as a printed circuit board. Typically, prismatic components are shipped from factory to factory in plastic shipping tubes, each holding as many as 25 components. Shipping the prismatic electronic components in tubes is very desirable since the components remain protected in the tube against physical damage and exposure to the elements.

After arrival of the component-containing tubes at the second factory, the components in each tube are fed to a component-placement device, such as a robot or dedicated machine, which places the components on the circuit board. Presently, there are advices which are capable of feeding a single size prismatic component from a shipping tube to the component-placement device. However, to feed prismatic components of a different size requires replacement of the component-feeding device with another capable of handling the different size component, often at a significant expense. Thus there is a need for a technique for easily feeding different size prismatic components.

BRIEF SUMMARY OF THE INVENTION

Briefly, in accordance with the present invention, a method is provided for automatically unloading a prismatic component stored in a shipping tube so that the components are positioned for transfer to a printed circuit board. The method is initiated by first positioning a component-containing tube, whose ends have been opened in a horizontal orientation so that the components in the tube are upside down.

Thereafter, a force is applied to the component closest to one end of the tube to at least partially expel a component from the other end of the tube. The partially expelled component is then displaced, typically by way of a first adjustable gripper, to a predetermined location. Once displaced to the predetermined location, the component is then rotated 180°, typically by a second adjustable gripper, so the component is now oriented right side up for pickup by a component-placement machine, such as a robot. Both of the first and second grippers which are adjustable thus allow different size prismatic components to be enaged upon expulsion from the tube and thereafter inverted so as to be positioned for pickup by the component-placement device.

In accordance with another aspect of the invention, a method is provided for unloading a prismatic component from a selected one of a plurality of tubes stored horizontally in a magazine so that the components in each tube are upside down. Initially, the magazine is indexed to place the selected tube, whose ends are opened, at an unload station. Therefater a force is applied to the component closest to one end of the tube at the unload staton to at least partially expel the component closest to the other end of the tube. The partially expelled component is then displaced, typically by a first adjustable gripper, to a predetermined location. Once displaced to the predetermined location, the component is then rotated 180°, typically by a second adjustable gripper, so the component is now oriented right side up for pickup by a component-placement machine, such as a robot.

DETAILED DESCRIPTION

Figure 1:
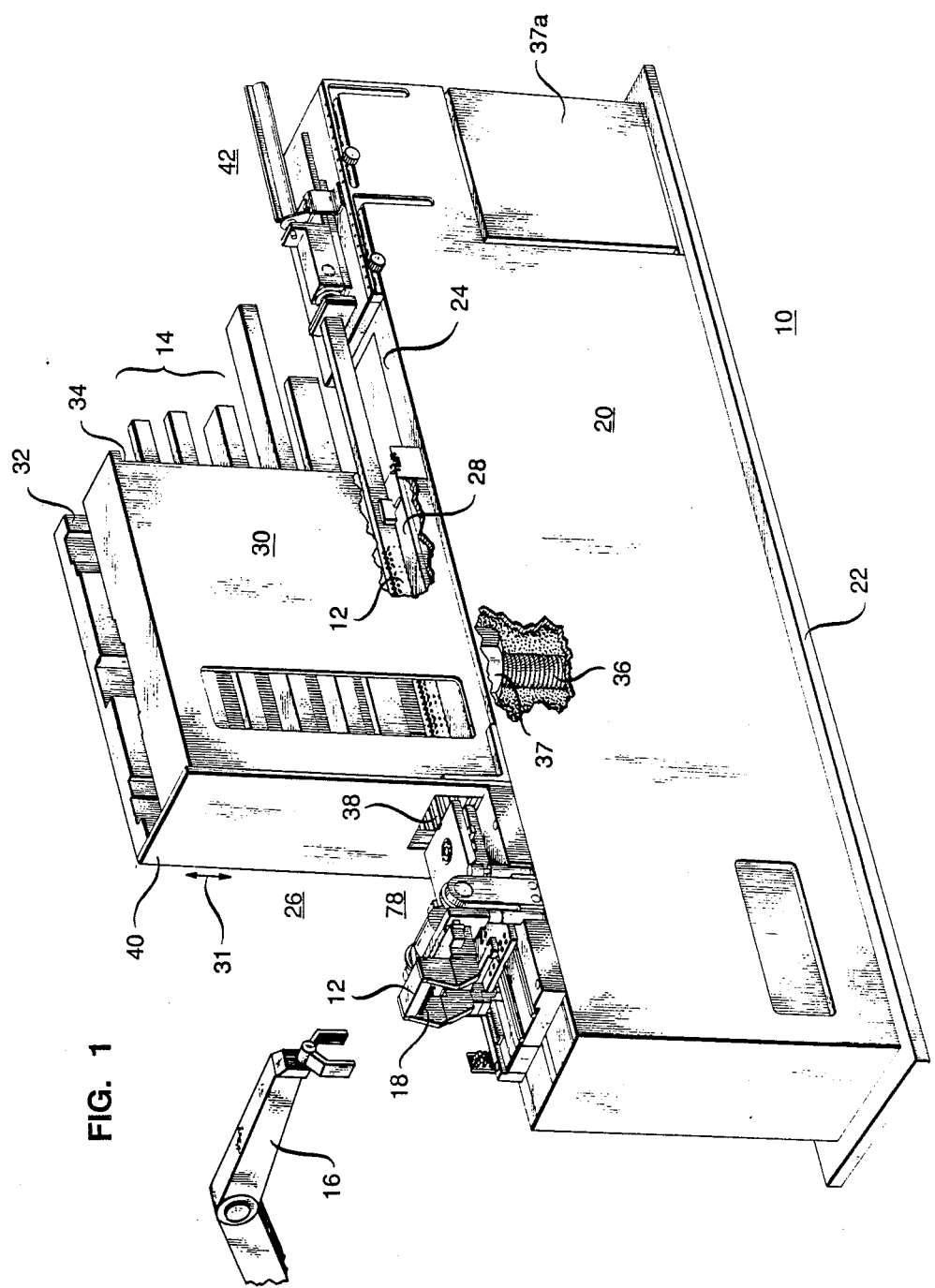
FIG. 1 is a perspective view of a parts-handling apparatus constructed in accordance with the present invention.

FIG. 1 illustrates an apparatus 10, in accordance with the invention, for removing a component 12 (best seen in FIG. 2) from a shipping tube 14 and then orienting the component for pickup by a pickup device 16, such as a robot. The robot 16, in turn, places the component 12 on a circuit board (not shown) for bonding (e.g., soldering) thereto in a well-known manner. The components 12 stored in each tube 14 are typically each prismatic in shape and have a set of leads 18 which depend from the bottom thereof. Typically the components 12 are stored in each tube 14 that the leads 18 of the components are aligned with each other.

As seen in FIG. 1, the apparatus 10 comprises a frame 20 which rests on a supporting surface 22. The frame 20 has an upper, flat surface 24, extending through which is a magazine 26 comprised of a carrier rack 28 which is secured within a housing 30 that is slidably mounted within the frame for vertical movement along an axis 31. The carrier rack 28 within the housing 30 serves to hold a plurality of the tubes 14 so that each is spaced horizontally one above the other. To accommodate different tubes 14 having lengths greater than that of the housing 30, a vertical slot 32 is provided in the rearward or right-hand end 34 of the housing, as seen in FIG. 1, so that the ends of the tubes can protrude therebeyond.

The tubes 14 are each loaded in the carrier rack 28 so that the components 12 in each tube are upside down (i.e., their leads 18 are facing vertically upward). Prior to loading the tubes 14 in the rack 28, the ends of each tube, which are normally sealed by a rubber stopper (not shown), are opened by removing the stopper. It is necessary for the ends of the tubes 14 to be opened in order for the apparatus 10 to remove the individual components 12 from each tube.

As shown in FIG. 1, inside the frame 20 there is a motorized lead screw 36 which engages a lead nut 37 on the housing 30. As the lead screw 36 is rotated, the housing 30 moves vertically along the axis 31. A control system 37a, which typically takes the form of a well-known programmable controller, controls the rotation of the lead screw 36 to raise or lower the housing 30 so as selected one of the tubes 14 in the rack is exposed through an opening 38 in a plate 40 which rises vertically from the surface 24. The tube 14, which has been positioned so that its forward end (left-hand end in FIG. 1) is exposed through the opening 38, is said to be in the "unload" position.

Figure 2:
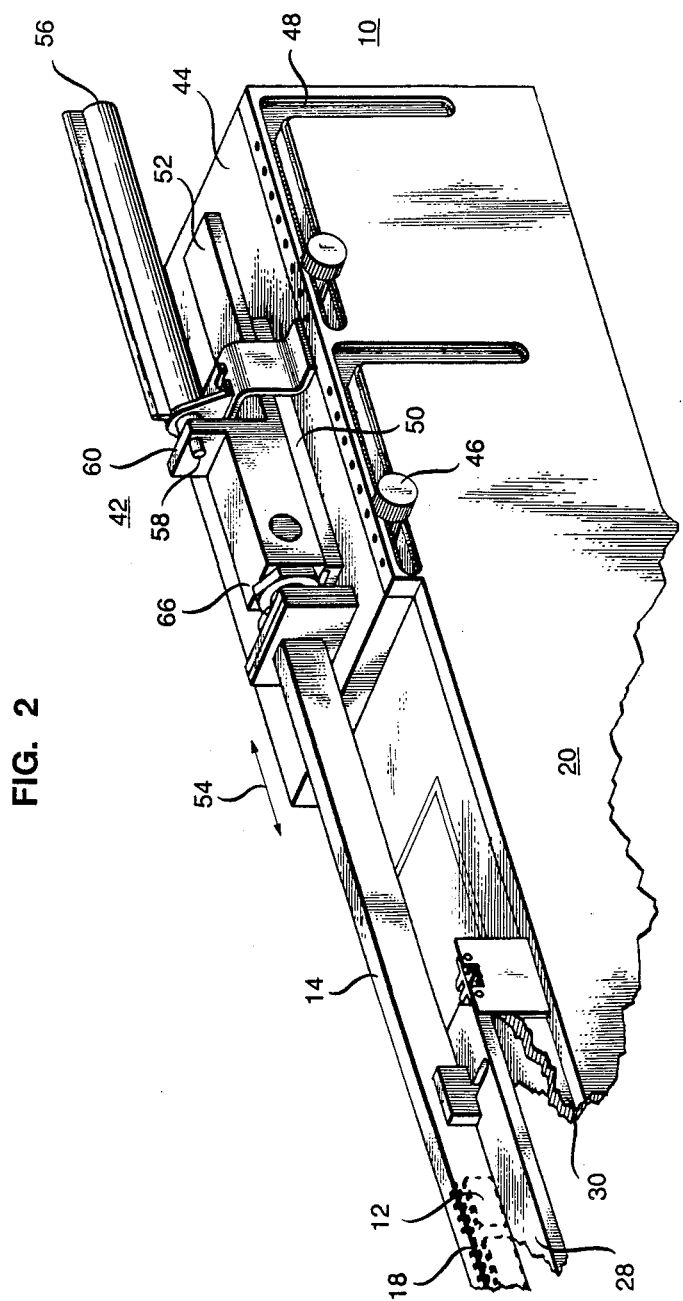
FIG. 2 is an enlarged view of a portion of the apparatus of FIG. 1 showing the details of a component-ejection mechanism thereon.
Figure 3:
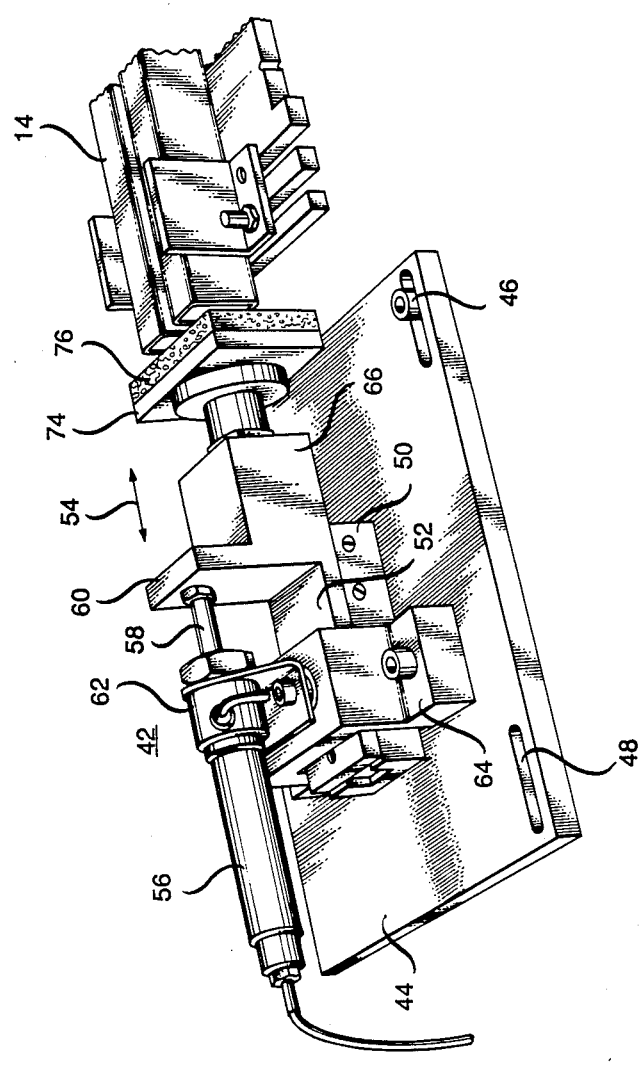
FIGS. 3 and 4 are each enlarged, perspective view of the component-ejection mechanism shown in FIG. 3 taken from opposite sides thereof.
Figure 4:
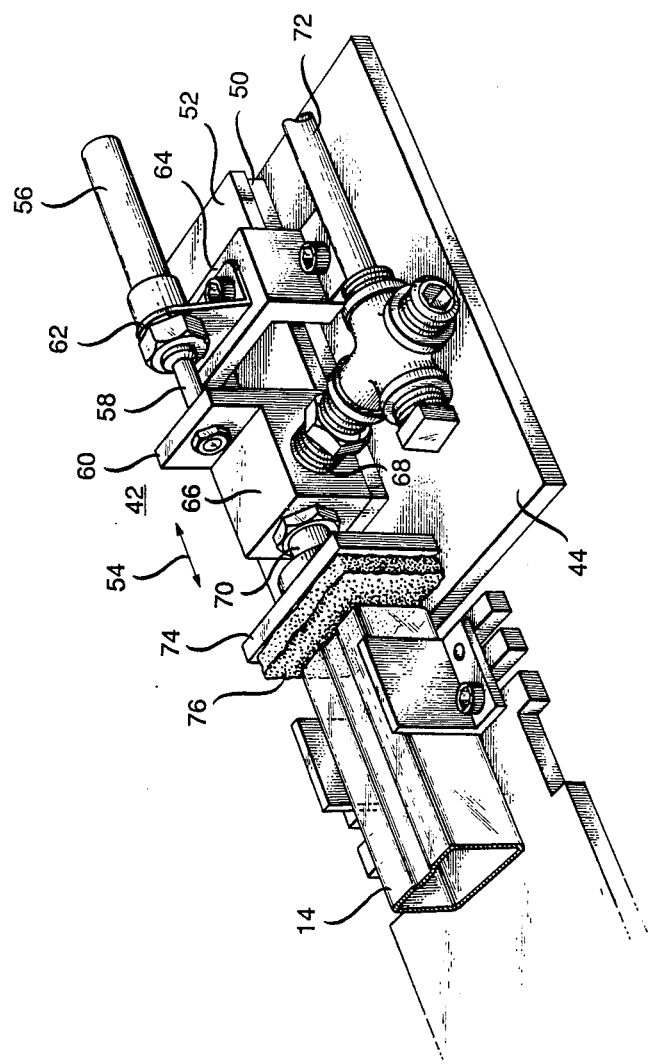

Adjacent to the rearward end of the housing 30, there is a component-ejection mechanism 42. As will become better understood from the description provided below, the ejection mechanism 42 serves to direct a burst of gas (i.e., air) into the rearward end (right-hand end as seen in FIG. 1) of the tube 14 in the unload position. The force of the gas directed into the rearward end of the tube 14 causes at least the partial expulsion of a component 12 from the forward or left-hand tube end as seen in FIG. 1. The details of the component-ejection mechanism 42 are best illustrated in FIGS. 2-4. Referring to those figures, the component-ejection mechanism 42 is comprised of a base plate 44, which has a pair of bolts 46 extending outwardly from each of its opposed lateral edges. Each of the bolts 46 extending out from the plate 44 is received in, and extends through, a separate one of four "L"-shaped slots 48 in the frame 20 (only two of which are shown). The "L" slots 48 allow the plate 44 to be moved parallel to, and below the level of, the top surface 24 of the frame 20 to permit loading of the tubes 14 in the carrier rack 28.

The plate 44 supports a base 50 to which a slide 52 is mounted for movement along an axis 54 parallel to the longitudinal axis of the tube 14 of FIG. 2 in the unload position. Referring to FIGS. 3 and 4, movement of the slide 52 along the axis 54 is accomplished by an actuator 56 (e.g., a pneumatic cylinder or solenoid) which has its shaft 58 secured to a wall 60 rising upwardly from the slide. The actuator 56 has its body secured to a yoke 62 which is attached to a bracket 64 that is secured to the plate 46. The operation of the actuator 56, and hence, the movement of the slide 52, is controlled by the control system 37a of FIG. 1.

The forward end of the slide 52 (the end closest to the tube 14 in FIGS. 2-4) has an integral head 66 within which is a passage (not shown). Referring to FIG. 4, the passage in the head 66 communicates with both inlet and outlet conduit 68 is coupled to a line 72 which carries a gas (typically air) under pressure. The air admitted into the head 66 through the inlet 68 is expelled from the head through the conduit 70 and into an opening (not shown) through a tiered flange 74 integral with the conduit. The flange 74 carries a gasket 76 on its forward face (the face closest the tube 14). When the head 66 is extended forward by the actuator 56, a substantially airtight seal is created between the outlet conduit 68 and the tube 14 by a gasket 76. In this way, when air is expelled from the opening through the flange 74, substantially all of the air enters the rear end of the tube 14, causing a component 12 to be at least partially expelled from the forward end of the tube.

Figure 5:
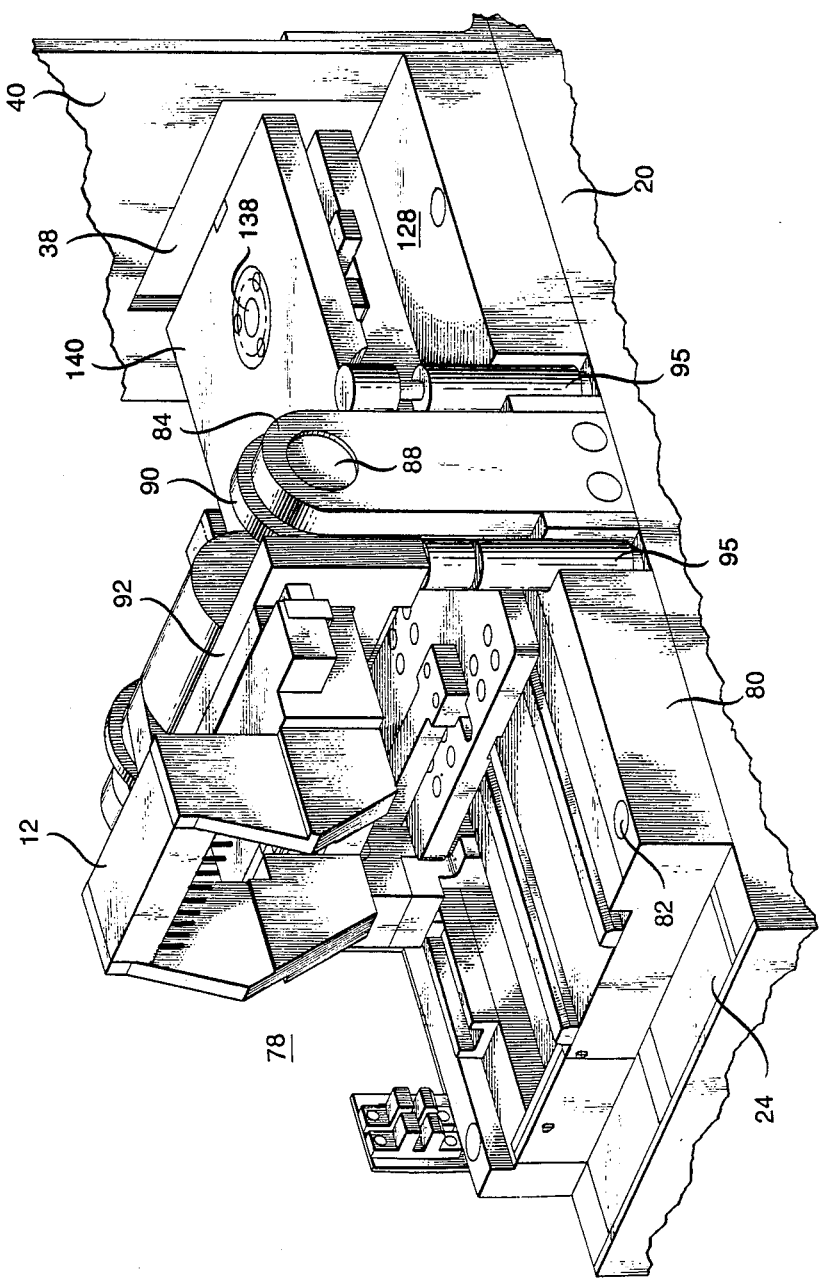
FIG. 5 is perspective view of a portion of the apparatus for FIG. 1 showing some of the details of a shuttle mechanism thereon.
Figure 6:
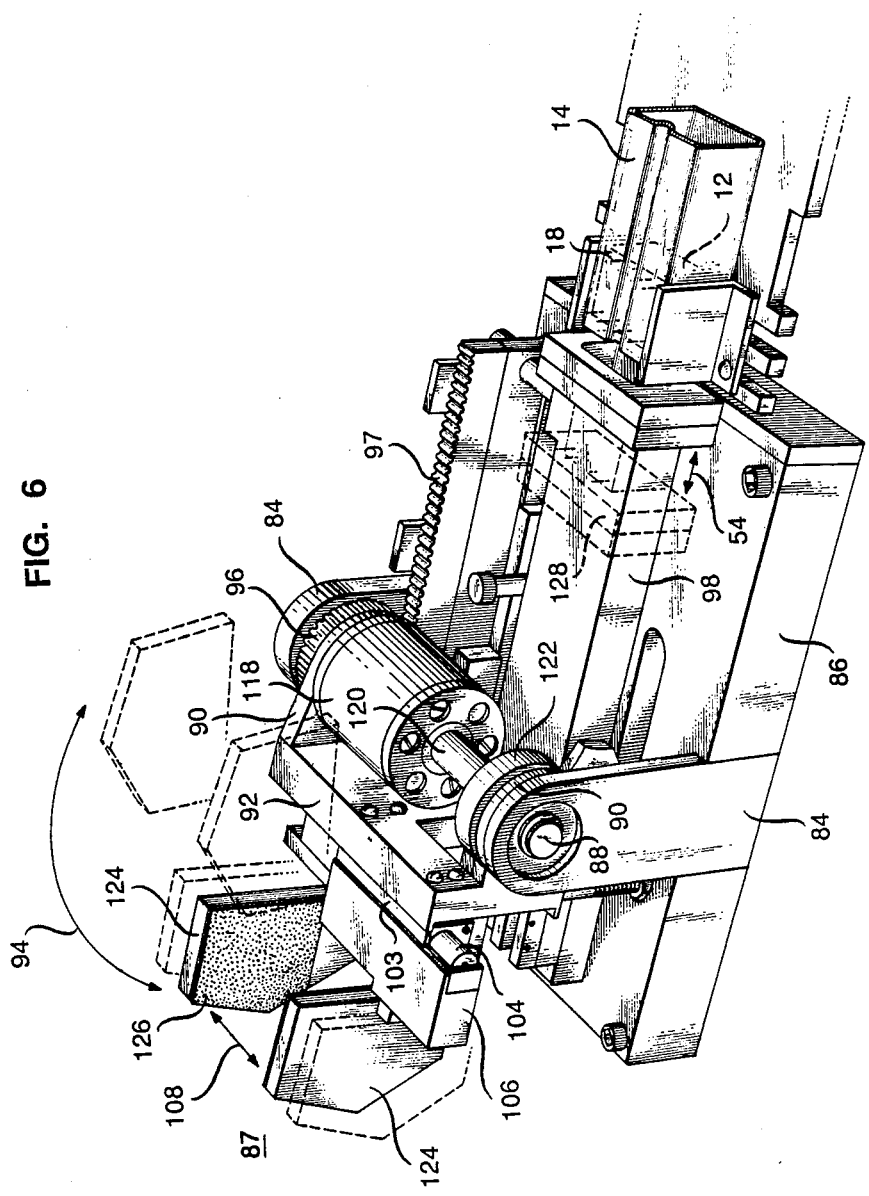
FIGS. 6 and 7 are each enlarged, perspective views of the shuttle apparatus of FIG. 5 taken from opposite sides thereof.
Figure 7:
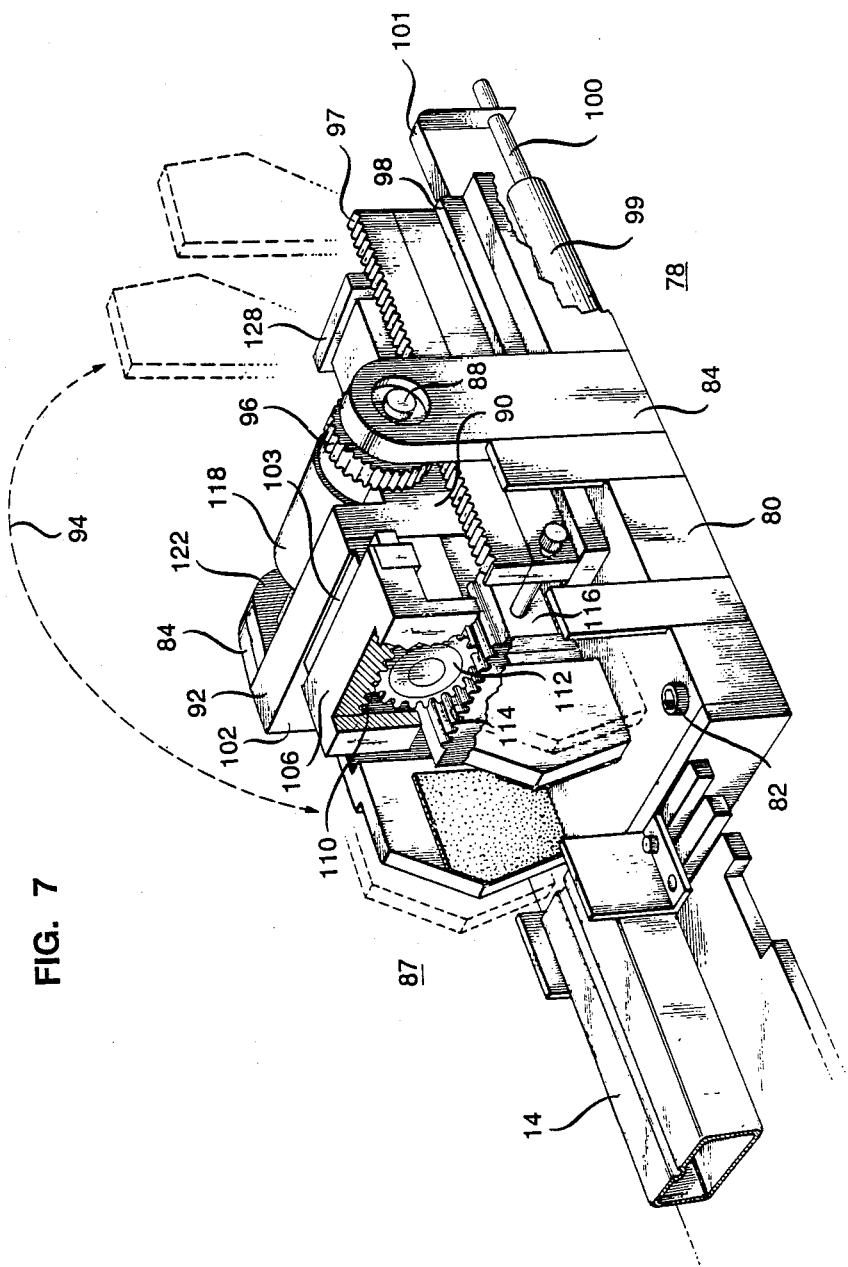

Referring to FIG. 1, the apparatus 10 includes a shuttle 78 for displacing each component 12 partially expelled from the tube 14 to a predetermined location and thereafter inverting the component 180° to position it for pickup by the robot 16. The details of the shuttle 78 are illustrated in FIGS. 5-7. As best seen in FIGS. 5 and 6, the shuttle 78 comprises a shuttle base 80 which is secured by a set of bolts 82 to the top surface 24 of the frame 20 so as to be adjacent to the opening 38 in the plate 40. The shuttle base 80 has a pair of arms 84 attached to, and rising upwardly from a separate one of a pair of sides 86. Referring to FIGS. 6 and 7, each of the arms 84 serves to rotatably journal a first gripper assembly 87 comprised of a separate one of a pair of pins 88 (only one shown), each secured to a separate one of a pair of legs 90 of a saddle 92. Each pin 88 freely rotates within a corresponding one of the arms 84, thus permitting the saddle 92 to rotate about an arc 94. Referring to FIG. 5, each of a pair of shock absorbers 95 rises upwardly from the surface 24 on either side of each leg 84 and serves as a positive stop for the saddle legs 90 upon rotation of the saddle 92 in the clockwise and counter-clockwise directions.

As shown in FIG. 7, one of the pair of pins 88 carries a gear 96 interposed between a corresponding saddle leg 90 and arm 84. Referring to FIG. 6, the gear 96 engages a rack 97 secured to one side of a slide 98 slidably mounted on the shuttle base 80 for movement along the axis 54. Referring to FIG. 7, the shuttle base 80 also mounts an actuator 99 (e.g., a pneumatic cylinder) which has its shaft 100 attached by a yoke 101 to the slide 98. Like the actuator 61, the actuator 99 is controlled by the control system 37a. When the actuator 99 is operated, its shaft 100 is displaced to and from the body of the actuator, causing the slide 98 to move to and from the tube 14.

Referring now to FIG. 5, the saddle 92 has a generally flat face 102 which carries a track 103 that extends laterally across the saddle face. The track 103 is slidably engaged by a bearing assembly 104 on the rearward end (righthand end as seen in FIG. 7) of a block 106. The slidable engagement of the bearing assembly 104 with the track 103 permits the block 106 to move back and forth along an axis 108 perpendicular to the axis 54. As seen in FIG. 7, on the undersurface of the block 106 there is a gear rack 110 which meshes with a gear 112 rotatably journalled for rotation to the saddle 92. The gear 112 also meshes with a rack 114 formed on the upper surface of the block 116, which as seen in FIG. 7, underlies the block 106.

Like the block 106, the block 116 has a bearing assembly (not shown) on its rearward end that is slidably mounted to a track (not shown) which extends laterally across the saddle face 102 in parallel spaced relationship below the track 103. While both of the blocks 106 and 116 are mounted for slidable movement along the axis 108, the blocks do not move independently of each other because of the engagement of the racks 110 and 114, respectively, with the gear 112. Instead, when one of the blocks 106 and 116 is displaced in a first direction along the axis 108, the other bock is moved in the opposite direction. Referring to FIG. 6, movement of the blocks 106 and 116 in opposite directions along the axis 108 is accomplished by way of a servo-actuator 118, typically a pneumatic cylinder or solenoid, which has its body attached to one of the saddle legs 90. The actuator 118 has a shaft 120 which extends out from the actuator parallel to the axis 108. The shaft 120 is coupled by a yoke 122 to the block 106. Like the actuator 99, the actuator 118 is controlled by the control system 37a.

As seen in FIGS. 6 and 7, each of the blocks 106 and 116 has a vertical jaw 124 integral with its forward end (the end distant from the saddle face 102). The jaws 124 oppose each other, so when the blocks 106 and 116 move towards each other, the jaws do likewise. In this way, the jaws 124 can releasably capture (grip) one of the components 12 therebetween as seen in FIG. 5. As best seen in FIG. 6, the jaws 124 each have a pad 126 on their opposing faces to protect the component 12 gripped therebetween against damage. The jaws 124 can be displaced different distances apart by the servo-actuator 118 and thus can grip different size components therebetween.

Referring to FIG. 6, the slide 98 is provided with a first gripper 128 at its rearward end (the end closest to the tube) which, in a preferred embodiment, takes the form of a vacuum pickup. The gripper 128 serves to engage the component 12 partially expelled from the forward end of the tube 14. Once engaged by the gripper 128, the component 12 can then be displaced forwardly (away from the tube 14) upon the forward movement (leftward movement as seen in FIG. 6) of the slide 98.

The overall operation of the apparatus 10 will now be described. At the outset of operation, the actuators 56, 99 and 118 are in their quiescent state, at which time the slides 52 and 98 are in their rearward position, and the jaws 124 are fully separated from each other. In order to feed a component 12 from a selected one of the tubes 14, the lead screw 36 is first rotated in accordance with commands from the control system 37 to position the housing 30 such that the selected tube is in the unload position, with the forward end of the selected tube exposed through the opening 38. Thereafter, the actuator 56 is operated to displace the slide 52 forwardly (leftwardly in FIG. 4) so the gasket 76 contacts the rearward end of the tube 14, now in the unload position. Air is then directed into the line 72 for passage through the head 66 and out from the opening through the flange 74. The air leaving the flange 74 enters the tube 14, striking the components 12 closest to the rearward (right-hand) end thereof.

The force of the air against the component 12 closest the rearward end of the tube 14 causes the component closest the forward end of the tube to be at least partially expelled therefrom. Once the component 12 has been at least partially expelled from the forward end of the tube 14, the component is thereafter engaged by the gripper 128 which remains at its rearward position, proximate the forward end of the tube. After the component 12 has been engaged by the gripper assembly 128, the actuator 99 is then operated to displace the slide 98 forwardly, causing the component 12 to be moved forwardly to a predetermined position distant from the forward end of the tube.

The forward movement of the slide 98 also causes the gear 96 to be rotated in a clockwise direction, which in turn, causes the saddle 92 to rotate clockwise through the arc 94. As best seen in FIG. 7, the clockwise rotation of the saddle 92 causes the jaws 124 to move from a forward position (at which the jaws are shown in phantom) to a rearward position (at which they are shown in solid lines). The forward movement of the slide 98 and the rotation of the saddle 92 are such that when the component 12 engaged by the gripper 128 is displaced to its predetermined forward position distant from the tube 14, the component lies between the jaws 124 once they reach their rearward position.

After the jaws 124 have been displaced to their rearward position, the actuator 118 is operated to displace the jaws 124 towards each other. In this way, the component 12 previously expelled from the tube 14 is gripped between the jaws 124. After the component 12 is gripped between the jaws 124, the actuator 99 is operated to displace the slide 98 rearwardly, causing the jaws to return to their forward position. As the jaws 124 return to their forward position, the component 12 gripped between the jaws rotates approximately 180°. The component 12, which was upside down when expelled from the tube 14, is now oriented right side up, and is thus properly oriented for pickup by the robot 16.

The rearward movement of the slide 98, which causes the jaws 124 to move to their forward position, also causes the gripper 128 to return to its original rearward position proximate the forward end of the tube 14. Thus, the gripper device 128 is now positioned to engage the next component 12 expelled, at least in part, from the tube 14. Upon the subsequent rearward movement of the slide 98, the component 12, now engaged by the gripper assembly device 128, is brought into position for engagement by the jaws 124 when they are returned to their rearward position.

The above-described steps are repeated until a predetermined number of components 12 are removed from the tube 14 currently in the unload position. Thereafter, the next selected tube 14 is placed in the unload position and the components 12 are successively removed therefrom. As may now be appreciated, the apparatus 10 can thus achieve automated unloading of components from each of a plurality of selected tubes 14.

Figure 8:
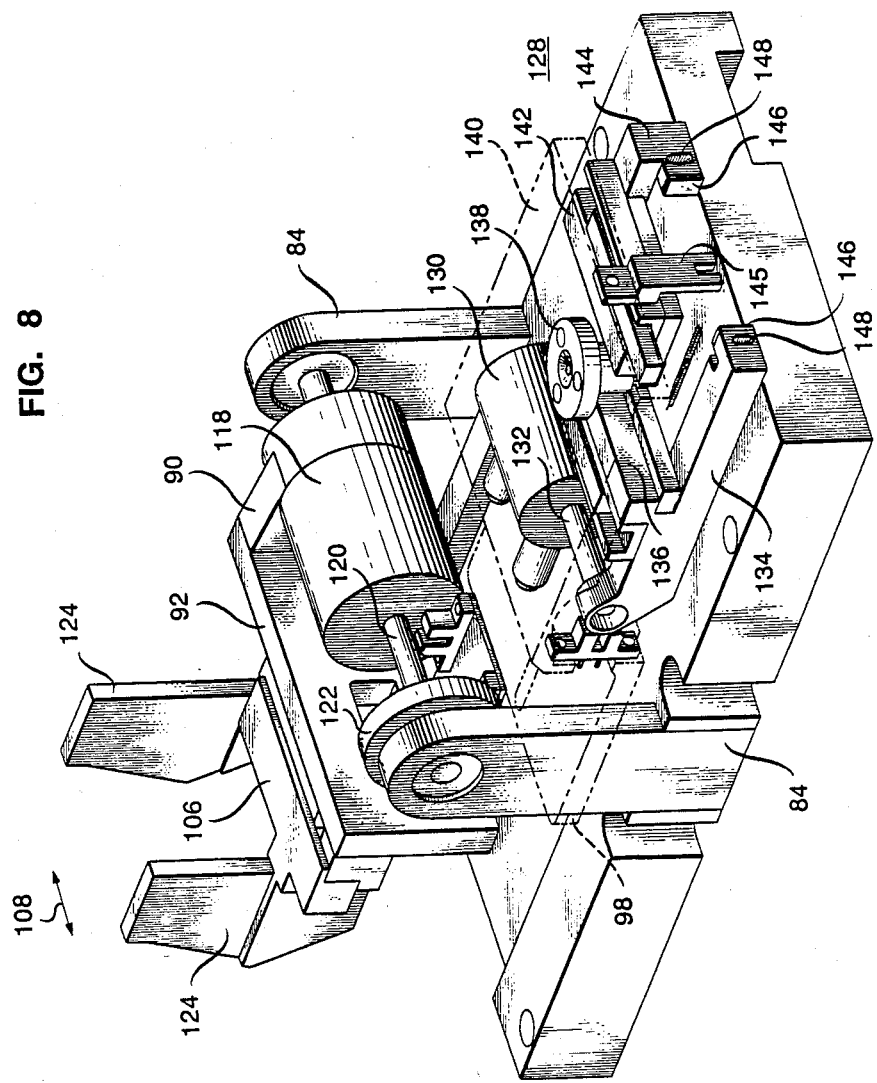
FIG. 8 is a perspective view of an alternate embodiment of the shuttle of FIGS. 6 and 7.

Referring now to both FIGS. 5 and 8, there is shown an alternate embodiment of the gripper 128. As best seen in FIG. 8, the alternate gripper 128 includes a servo-actuator 130 mounted to the slide 98. The actuator 130 has a shaft 132 extending therefrom parallel to the shaft 120 on the actuator 118. Attached to the shaft 132 is a first jaw 134 which moves along an axis parallel to the axis 108 when the actuator 130 is actuated by the control system 37 (see FIG. 1) to withdraw its shaft into the actuator.

The jaw 134 carries a gear rack 136 which runs along the jaw parallel to its direction of movement. The gear rack 136 meshingly engages a gear 138 rotatably journalled to a housing 140 (shown in phantom) overlying the actuator 130 and a portion of the jaw 134. The gear 138 also meshes with a gear rack 142 carried by a second jaw 144 slidably mounted to the jaw 134. The gear racks 136 and 142 are positioned opposite each other so that when the jaw 136 is displaced by the actuator 130, the meshing engagement of the gear 138 with the racks causes the jaws 134 and 144 to move in opposite directions. The jaws 134 and 144 can be moved varying distances apart by the servo-actuator 130 to permit different size components 12 to be gripped therebetween. The jaw 144 carries a stop member 145 which serves to limit how far out the component 12 is expelled from the tube 14.

Each of the jaws 134 and 144 has a component-engaging face 146 which opposes the component-engaging face on the other jaws. As their name implies, the component-engaging faces 146 on the jaws 134 and 144 are situated for engaging each of a pair of opposed edges on the component 12 (see FIG. 6) at least partially expelled from the tube 14 in FIG. 6. At the forward end of each jaw is a vacuum port 148 which is coupled to a source of vacuum (not shown).

The gripper 128 of FIG. 8 has the advantage of operating in each of two different modes to pick up either a relatively large or relatively small component 12. To pick up a relatively large component 12, the jaws 134 and 146 are actuated by the actuator 130 to grip the component therebetween. Relatively small components are picked up by first displacing the jaws 134 and 144 towards each other, and then utilizing the vacuum force created by drawing a vacuum through the ports 148.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for automatically fabricating a circuit board comprising the steps of:
   unloading at least one component from a component-containing shipping tube so that the component is positioned for transfer to a circuit board; and
   transferring the component to a circuit board for placement thereon;
   CHARACTERIZED IN THAT the component is unloaded from the tube by the steps of:
   positioning the shipping tube, whose ends have been opened, in a horizontal orientation such that the component in the tube is upside down;
   at least partially expelling the component from one end of the tube; and
   displacing the expelled component away from the tube and rotating the component approximately 180° so that the component is oriented right side up and is positioned for engagement.

2. A method for automatically fabricating a circuit board comprising the steps of:
   unloading at least one component from a component-containing shipping tube so that the component is positioned for transfer to circuit board; and
   transferring the component to the circuit board for placement thereon;
   characterized in that the component is unloaded from the tube by the steps of:
   positioning the shipping tube, whose ends have been opened, in a horizontal orientation, such that the component in the tube is upside down;
   at least partially expelling the component from one end of the tube;
   engaging the expelled component with a first adjustable gripper;
   displacing the first adjustable gripper away from the end of the tube to move the component to a predetermined location;
   simultaneously rotating a second adjustable gripper in a first direction through an arc of approximately 180° so that the second gripper is positioned to engage the component once it moves to the predetermined location;
   operating the second gripper to engage the component; and
   rotating the second gripper in a direction opposite to the first direction through an arc of approximately 180° to orient the component right side up.

3. A method for automatically fabricating a circuit board comprising the steps of:
   unloading at least one component from a component-containing shipping tube so that the component is positioned for transfer to a circuit board; and
   transferring the component to the circuit board for placement thereon;
   characterized in that the component is unloaded from the tube by the steps of:
   positioning the shipping tube, whose ends have been opened, in a horizontal orientation, such that the component in the tube is upside down;
   at least partially expelling the component from one end of the tube by directing a stream of gas into the other end of the tube; and
   displacing the expelled component away from the tube and rotating the component approximately 180° so that the component is oriented right side up and is positioned for engagement.

4. A method for automatically fabricating a circuit board comprising the steps of:
   unloading at least one component from a component-containing shipping tube so that the component is positioned for transfer to a circuit board; and
   transferring the component to the circuit board;
   characterized in that the component is unloaded from the tube by the steps of:
   positioning a selected one of a plurality of horizontally oriented, component-containing shipping tubes, each having open ends, in an unload position such that each component in the tube is upside down;
   at least partially expelling the component from one end of the selected tube; and
   displacing the expelled component away from the tube and rotating the component approximately 180° so that the component is oriented right side up.

5. The method according to claim 4, characterized in that the expelled component is displaced from the tube and rotated by the steps of:
   engaging the expelled component with a first adjustable gripper; displacing the first adjustable gripper away from the tube to move the component to a predetermined location;
   simultaneously rotating a second adjustable gripper in a direction through an arc of approximately 180° so that the second gripper is positioned to engage the component once it moves to the predetermined location;
   operating the second gripper to engage the component; and
   rotating the second gripper in a direction opposite to the first direction through an arc of approximately 180° to orient the component right side up.

6. The method according to claim 4, characterized in that the component is expelled from the tube by directing a stream of gas into the other end of the tube.

7. A method for fabricating a circuit board comprising the steps of:
   unloading at least one component from at least one component-containing shipping tube so that the component is positioned for transfer to a circuit board; and
   transferring the component to a circuit board;
   characterized in that the component is unloaded from the tube by the steps of:
   positioning the shipping tube, whose ends have been opened, in a horizontal orientation such that the component in the tube is upside down;
   expelling a component from one end of the tube;
   displacing the expelled component away from the tube to a predetermined location;

simultanously rotating an adjustable gripper in a first direction through an arc of approximately 180° to position the gripper to engage the component once it has been displaced to the predetermined location.

operating the gripper to grip the component; and rotating the gripper in a direction opposite to the first direction through an arc of approximately 180° to orient the component right side up.

8. The method according to claim 7, characterized in that the step of positioning the shipping tube includes the step of indexing a plurality of shipping tubes to position a selected one of the tubes in the horizontal orientation.

9. Apparatus for feeding at least one component stored in a shipping tube characterized by:

means for positioning a component-containing tube in a horizontal orientation such that the component in the tube is upside down;

means for at least partially expelling the component from the tube; and means for displacing the expelled component and rotating it approximately 180° to orient the component right side up.

10. The apparatus according to claim 9, characterized in that said positioning means comprises:

a rack containing a plurality of horizontally oriented shipping tubes stacked vertically one above the other; and means for vertically displacing the rack to locate a selected one of the tubes in a position at which a component can be expelled therefrom.

11. The apparatus according to claim 8, characterized in that the means for expelling the component comprises means for directing a gas into one end of the tube to cause the component to be expelled from the other end thereof.

12. The apparatus according to claim 8, characterized in that the means for displacing and rotating the component comprises:

a support;

a saddle journalled to the support for rotation about an arc between a forward and a rearward position;

a pair of jaws each slidably mounted to said saddle for lateral movement to and from each other;

means for moving the jaws in opposite directions;

component pickup means slidably mounted to said support for movement between a rearward position proximate the tube and a forward position proximate with the rearward position of the saddle; and means for moving said component pickup means from its rearward to its forward position while simultaneously rotating the saddle from its forward to its rearward position and vice versa.

13. Apparatus for expelling a component from a shipping tube and for orienting the expelled component for pickup, CHARACTERIZED BY a magazine for holding at least one component-containing shipping tube, whose ends are open, in a horizontal orientation such that each component in the tube is upside down;

a component-ejection mechanism for directing a stream of gas into the tube to cause a component to be at least partially expelled therefrom;

a first gripper for displacing the component which is at least partially expelled from the tube to a predetermined location distant from the tube; and a second gripper operating in cooperation with the first gripper for rotating the component once it has been displaced to the predetermined location to position the component right side up for pickup.

14. The apparatus according to claim 13, characterized in that the first gripper includes a vacuum pickup device.

15. The apparatus according to claim 13, characterized in that said first gripper comprises the combination of a pair of jaws and a vacuum pickup.

16. The apparatus according to claim 13, characterized in that said second gripper comprises a pair of adjustable jaws for gripping different size components therebetween.

* * * * *